Jan. 13, 1970 S. S. BAIRD 3,488,834
MICROELECTRONIC CIRCUIT FORMED IN AN INSULATING
SUBSTRATE AND METHOD OF MAKING SAME
Filed Oct. 20, 1965 3 Sheets-Sheet 1

INVENTORS
Stephen S. Baird
BY Henry K. Woodward

INVENTORS
Stephen S. Baird
BY
Henry K. Woodward

INVENTORS
Stephen S. Baird
BY
Henry K. Woodward 3,488,834

MICROELECTRONIC CIRCUIT FORMED IN AN INSULATING SUBSTRATE AND METHOD OF MAKING SAME

Stephen S. Baird, Richardson, Tex., assignor to Texas Instruments Incorporated, Dallas, Tex., a corporation of Delaware Filed Oct. 20, 1965, Ser. No. 498,381
Int. Cl. B01j *17/00;* H01l *1/16*
U.S. Cl. 29—577 4 Claims

ABSTRACT OF THE DISCLOSURE

A method is disclosed for forming spaced regions of semiconductor material in an insulating substrate for providing a microelectronic circuit. In addition, a device is disclosed including a plurality of spaced regions of semiconductor material electrically insulated from one another through the substrate. In the disclosed method mesas are selectively formed at one surface of a semiconductor wafer, the surface is coated with an insulating material to support the mesas at the one surface of the semiconductor wafer, and the semiconductor wafer is then removed to leave the semiconductor mesas embedded in the substrate.

This invention relates to electronic circuits, and more particularly to miniature electronic circuits wherein all circuit components are supported in a common substrate and are electrically isolated from one another through the substrate.

An object of the invention is a process for producing in a minimum of steps a number of circuit components in an electrically insulating substrate which may be electrically interconnected to form a microelectronic circuit. Another object of the invention is a microelectronic circuit wherein the circuit components are mounted in a substrate of dielectric material which provides insulated electrical isolation of the circuit components. Still another object is a microelectronic circuit having electrical components of more than one semiconductor material.

These and other objects and features of the invention will be better understood from the following description and appended claims, when read in conjunction with the attached drawings, in which:

FIGURES 1*a*–1*e* are pictorial views in section of a semiconductor wafer and glass substrate which illustrate steps of one method of producing a microelectronic circuit in accordance with the invention.

FIGURES 2*a*–2*f* are pictorial views in section of a semiconductor wafer and glass substrate which illustrate steps of another method of producing a microelectronic circuit in accordance with the invention.

Figure 3A:
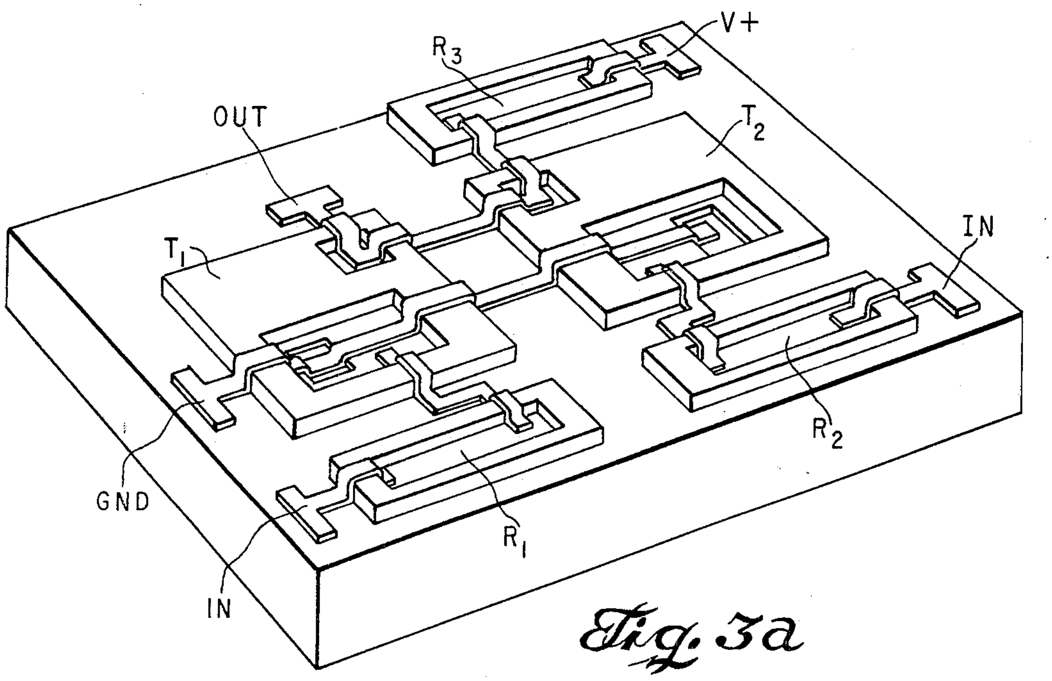
Figure 3B:
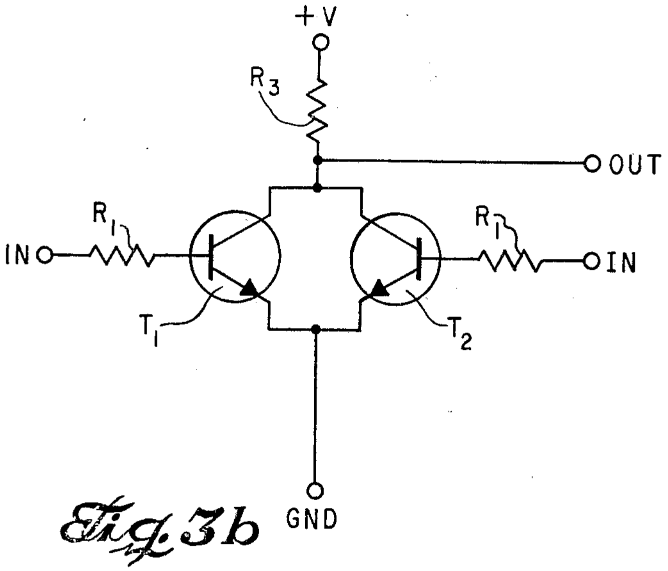

FIGURE 3*a* is a pictorial view in section of a microelectronic circuit formed by the process illustrated in FIGURES 1*a*–1*e*, and FIGURE 3*b* is the schematic of the circuit illustrated in FIGURE 3*a*.

In accordance with the invention, single crystalline semiconductor circuit components are supported by a glass substrate. The substrate, an insulating material, provides electrical isolation of the circuit components. In one embodiment, mesas are formed by etching on one side of a semiconductor wafer. Initially the wafer may have an epitaxial layer of N+ or P+ material depending upon device requirements. After the mesas are formed, the side of the wafer having the mesas is coated with a high temperature glass, a glass with a working temperature above approximately 900° C., which has a coefficient of thermal expansion substantially matching the coefficient of thermal expansion of the semiconductor material. The layer of glass has sufficient thickness to give mechanical strength to the microminiature circuit subsequently formed thereon. After the glass coating has been applied, the exposed surface of the semiconductor wafer is removed by lapping or etching, for example, leaving only the mesa portions of the wafer embedded in the glass substrate. The desired circuit components can then be formed in the embedded semiconductor material by conventional masking, etching and diffusing techniques. Finally, ohmic leads and contacts are provided to interconnect the components and complete the circuit.

In another embodiment, a glass coating can be applied to a plane surface on one side of a semiconductor wafer. The exposed side of the wafer is then scribed to fracture the crystalline structure of the wafer in a desired pattern. An etchant is applied to this side of the wafer and the semiconductor material is preferentially etched along the scribed areas, thus leaving islands of semiconductor material on the glass substrate. The glass is then heated to its working point and pressure is applied to the remaining semiconductor material to embed the islands of semiconductor material in the glass. The glass surface can be polished, if necessary, to obtain a plane surface for subsequent operations.

In another embodiment, bodies of silicon, germanium, gallium arsenide, or any combinations thereof can be embedded in a single glass substrate. Thus a circuit can be obtained which includes several types of semiconductor components, thereby utilizing the particular electrical and thermal characteristics of each of the semiconductor materials.

Figures 1A, 1B, 1C, 1D, 1E:
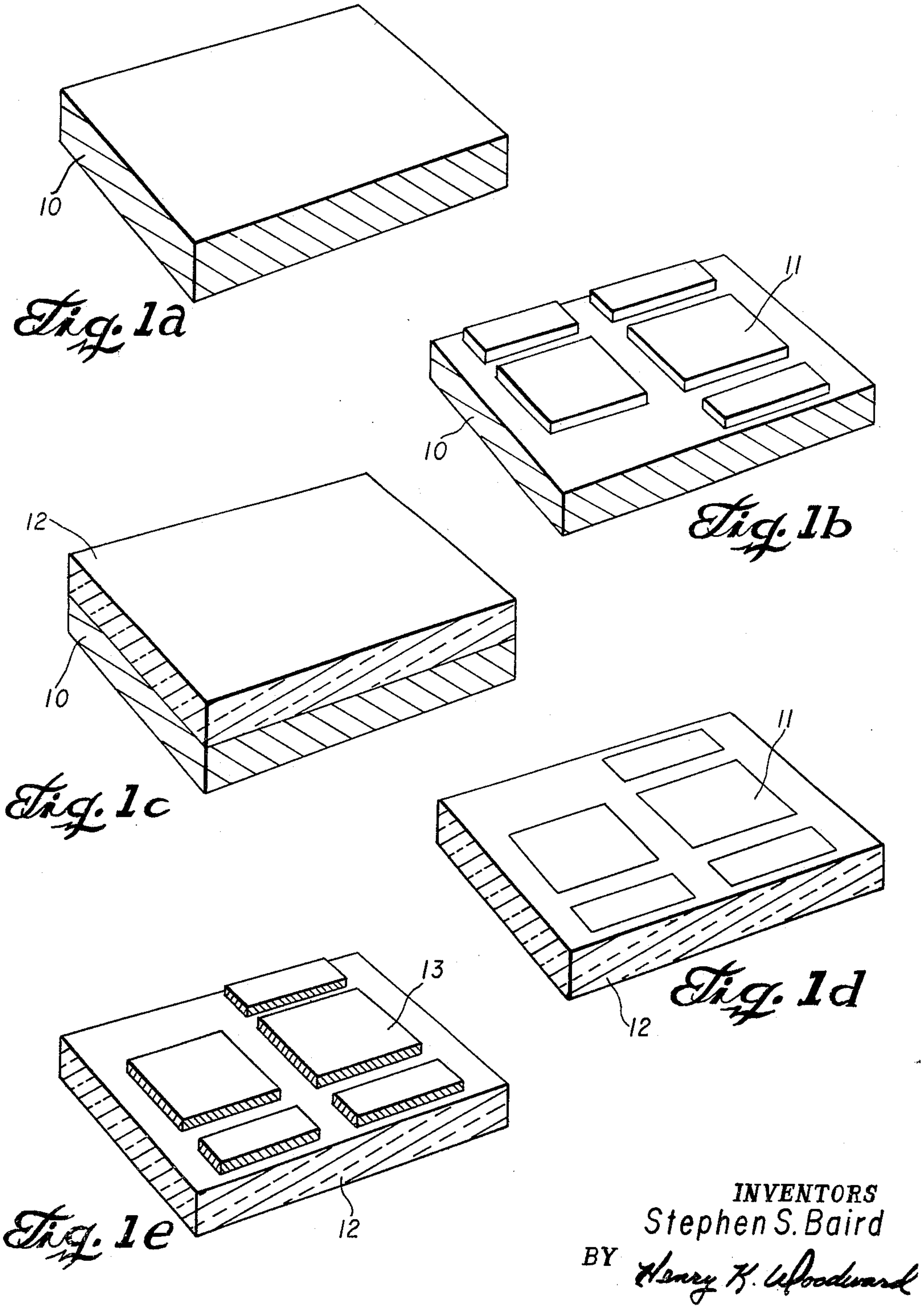

A preferred embodiment of the invention will be described with reference to FIGURES 1*a*–1*e*. Illustrated are steps of a method for making the logical "NOR" circuit shown in FIGURE 3*a* and FIGURE 3*b*. In FIGURE 1*a*, a portion of a semiconductor wafer 10 is shown. The wafer 10 may be a single crystal or a single crystal with an epitaxial layer, depending on device requirements. In this illustrative embodiment, N-type silicon is used; however, the material could be germanium or gallium arsenide. Conventional photomasking and etching techniques are utilized to form mesas 11 on the wafer 10 as shown in FIGURE 1*b*. In FIGURE 1*c*, a high temperature alumina silica glass 12 is coated on the side of the wafer having the mesas. The glass is chosen to have a coefficient of thermal expansion substantially the same as the silicon over the temperature range of 0° C. to 1100° C. One convenient technique for applying the glass to the semiconductor wafer is by using a photoresist-glass mixture as described in patent application Ser. No. 314,743, filed by Stephen S. Baird and James A. Cunningham on Oct. 8, 1963, and assigned to the assignee of the present application. With this technique, a mixture of glass particles and a photoresist polymer, such as Eastman Kodak KMER, is applied to the wafer surface by a settling or a centrifugal process, taught in the above-identified aplication. Subsequently, the photoresist polymer is developed to provide a temporary bond for the glass particles. The wafer and glass coating are then fired at a sufficient temperature to melt the glass and burn away the polymer. After the wafer and glass are cooled, the semiconductor wafer 10 is removed by lapping or etching. In FIGURE 1*d*, the glass substrate 12 has been rotated 180° and the wafer has been removed, leaving only the mesas 11 embedded in the glass substrate 12. The glass must have sufficient thickness to provide mechanical support for the mesas, but should also be readily scribed and broken. A glass thickness of 5 mils is satisfactory. In FIGURE 1*e*, a silicon oxide layer 13 is formed on the exposed surfaces of the mesas. This is accomplished by oxidizing the semiconductor material, if silicon, or by depositing silicon oxide by using an organometallic compound such as tetraethoxysilane, in either an oxidative or pyrolytic process, both processes being well known in the art. Conventional photomasking, etching and diffusing processes are then used to form the base and emitter regions of the transistors $T_1$ and $T_2$ and the resistors $R_1$, $R_2$ and $R_3$ for the circuit illustrated in FIGURE 3*a*. Rather than having diffused resistors, thin film resistors of Nichrome, for example, can be applied to the surface of the glass substrate. Lastly, ohmic leads and contacts are provided to complete the circuit.

Figures 2A, 2B, 2C, 2D, 2E, 2F:
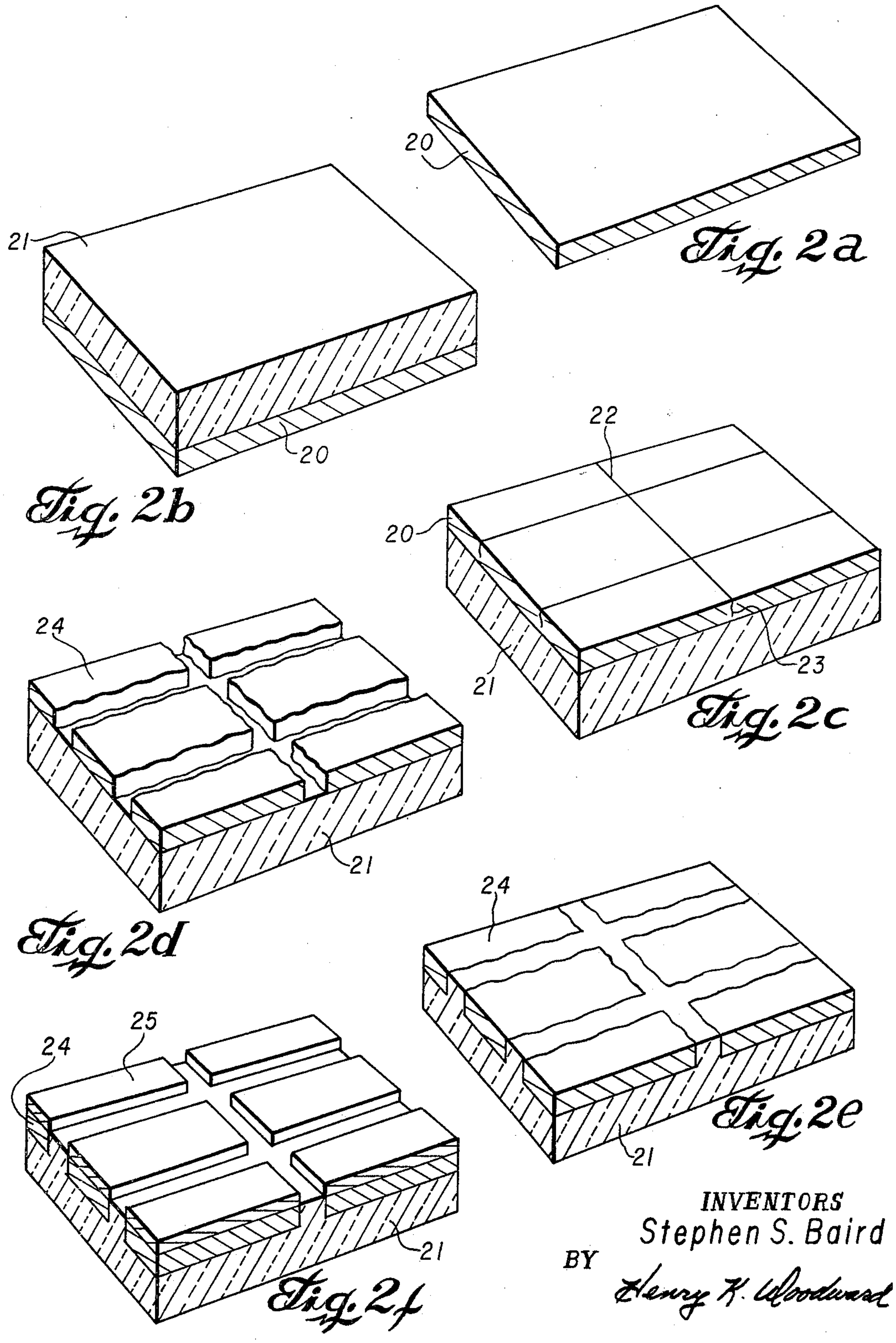

Another illustrative embodiment is shown in FIGURES 2*a*–2*f*. Again steps of a method for making the logical "NOR" circuit of FIGURE 3*a* are described. FIGURE 2*a* is a portion of a semiconductor wafer 20, again N-type silicon, for example. In FIGURE 2*b* a glass layer 21 is applied to a plane surface of the wafer 20. In FIGURE 2*c*, the wafer is rotated 180° and the exposed surface of the semiconductor wafer 20 has been scribed to fracture the crystalline structure as illustrated by the scribed line 22 and the fracture 23. Next, the surface of the semiconductor wafer 20 may be masked in a pattern which exposes only the scribed portions; however, this step is not necessarily required as an etchant will preferentially attack the scribed and fractured portions of the semiconductor wafer 20. The semiconductor wafer 20 is then etched, preferably by an alkaline etchant such as sodium hydroxide which does not attack the glass. The etchant preferentially etches the damaged areas of the semiconductor wafer, leaving islands 24 of semiconductor material as shown in FIGURE 2*d*. Next, the glass layer 21 is heated to its working point and the semiconductor islands 24 are pressed into the glass layer 21, as shown in FIGURE 2*e*. The surface of the glass layer can then be polished, if necessary, to obtain a plane surface for subsequent operations. However, it may be possible to obtain sufficient planarity without polishing if, for example, polished silicon carbide pressure plates are used. In FIGURE 2*f*, the semiconductor islands 24 are coated with a silicon oxide film 25. Again, this may be accomplished either by oxidizing the surface of the semiconductor, if silicon, or by vapor deposition of silicon oxide. Finally, the desired circuit components are formed in the masked semiconductor islands by employing conventional photomasking, etching, and diffusing techniques. The circuit components are then interconnected to provide a circuit similar to FIGURE 3*a*.

The process of this inventioin offers the advantage of having mocroelectronic circuits with components of more than one semiconductor material. For instance, silicon or germanium transistors, whose electrical characteristics such as leakage current and current gain increase with temperature, can be used in conjunction with gallium arsenide transistors whose electrical characteristics drop off with temperature increase. Thus, temperature compensation can be built into a circuit by proper choice of semiconductor components. The several semiconductor materials can be placed on a suitable glass substrate, an alumina-silica-lead oxide glass for example, and then pressed into the glass substrate in a manner as described with reference to FIGURES 2*a*–2*f*.

While the invention has been described with reference to specific methods and embodiments, it is to be understood that this description is not to be construed in a limiting sense. Various modifications of the disclosed embodiments, as well as other embodiments of the invention will become apparent to persons skilled in the art without departing from the spirit and scope of the invention as defined by the appended claims.

What is claimed is:

1. In a method of fabricating in an insulating substrate individual circuit components for a microelectronic circuit, said circuit components being electrically isolated from one another through said substrate, the steps of:

(a) coating a surface of a semiconductor wafer with an insulating material, thereby forming a supporting substrate,
(b) scribing the opposite, exposed surface of said semiconductor wafer, thereby selectively fracturing the crystalline structure of said semiconductor wafer,
(c) applying an etchant to said semiconductor wafer until the fractured portions of the semiconductor wafer are removed,
(d) heating said supporting substrate, and
(e) embedding the remaining semiconductor material in said supporting substrate.

2. In a method of fabricating individual circuit components for a microelectronic circuit in an insulating substrate, said circuit components being electrically isolated from one another through said substrate, the steps of:

(a) selectively forming mesas on a surface of a semiconductor wafer,
(b) coating said surface with an insulating material thereby forming a supporting substrate which embeds said mesas,
(c) scribing the opposite surface of said semiconductor wafer to selectively fracture the crystalline structure of said semiconductor wafer,
(d) applying an etchant to said semiconductor wafer until the fractured portions of the semiconductor wafer are removed, and
(e) removing the remaining semiconductor wafer, leaving only the semiconductor mesas embedded in said insulating substrate.

3. A method of fabricating a microelectronic circuit in an insulating substrate including the steps of:

(a) coating a surface of a semiconductor wafer with an insulating material to form a supporting substrate,
(b) scribing the opposite exposed surface of said semiconductor wafer to selectively fracture the crystalline structure of said semiconductor wafer,
(c) applying an etchant to said semiconductor wafer until the scribed and fractured portions of the semiconductor wafer are removed,
(d) heating said supporting substrate,
(e) applying pressure to the remaining semiconductor material whereby said remaining semiconductor material is embedded in said supporting substrate,
(f) forming a silicon oxide film over the exposed surfaces of the embedded semiconductor material,
(g) selectively diffusing doping impurities into the embedded semiconductor material to form circuit components, and
(h) applying ohmic leads and ohmic contacts thereby interconnecting the components to perform the desired circuit function.

4. The method described in claim 3 including the step of applying a resistive film to the surface of the glass substrate to form resistive circuit components.

References Cited

UNITED STATES PATENTS

| | | | |
|---|---|---|---|
| 3,308,354 | 3/1967 | Tucker | 29—589 |
| 3,320,485 | 5/1967 | Buie | 29—580 |
| 3,332,137 | 7/1967 | Kenney | 29—580 |

PAUL M. COHEN, Primary Examiner

U.S. Cl. X.R.

29—580, 589; 317—101